United States Patent
Yang et al.

(10) Patent No.: US 9,324,608 B2
(45) Date of Patent: *Apr. 26, 2016

(54) METHOD FOR VIA PLATING WITH SEED LAYER

(71) Applicant: Taiwan Semiconductor Manufacturing Co., Ltd., Hsin-Chu (TW)

(72) Inventors: Shin-Yi Yang, New Taipei (TW); Ching-Fu Yeh, Hsin-Chu (TW); Tz-Jun Kuo, Zhudong Township (TW); Hsiang-Huan Lee, Jhudong Township (TW); Ming-Han Lee, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/720,264

(22) Filed: May 22, 2015

(65) Prior Publication Data

US 2015/0255334 A1 Sep. 10, 2015

Related U.S. Application Data

(63) Continuation of application No. 14/072,890, filed on Nov. 6, 2013, now Pat. No. 9,054,163.

(51) Int. Cl.
*H01L 21/44* (2006.01)
*H01L 21/768* (2006.01)
*H01L 21/288* (2006.01)

(52) U.S. Cl.
CPC ...... *H01L 21/76873* (2013.01); *H01L 21/2885* (2013.01); *H01L 21/76802* (2013.01); *H01L 21/76843* (2013.01); *H01L 21/76861* (2013.01); *H01L 21/76871* (2013.01); *H01L 21/76877* (2013.01); *H01L 21/76879* (2013.01)

(58) Field of Classification Search
CPC ............... H01L 21/76879; H01L 21/76871; H01L 21/283; H01L 21/2885; H01L 21/76873; H01L 21/76877
USPC .......................... 438/637, 639, 672, 675, 687
See application file for complete search history.

(56) References Cited

U.S. PATENT DOCUMENTS

| | | | |
|---|---|---|---|
| 6,593,236 B2 | 7/2003 | Pyo | |
| 8,026,605 B2 | 9/2011 | Dordi et al. | |
| 8,133,812 B2 | 3/2012 | Dordi et al. | |
| 9,054,163 B2 * | 6/2015 | Yang | H01L 21/76879 |
| 2005/0098440 A1 | 5/2005 | Kailasam et al. | |
| 2009/0117733 A1 | 5/2009 | Dubin et al. | |

* cited by examiner

*Primary Examiner* — Kevin M Picardat
(74) *Attorney, Agent, or Firm* — Slater & Matsil, L.L.P.

(57) ABSTRACT

Presented herein is a method for plating comprising providing a substrate having a dielectric layer formed over a trace, and forming a via/trench opening extending through the dielectric layer, the via/trench opening exposing a surface of the trace. The method further comprises forming a seed layer in the via/trench opening and contacting the trace and forming a protection layer over the seed layer. The protection layer is removed and a conductive layer deposited on the seed layer in a single plating process step by applying a plating solution in the via/trench opening.

20 Claims, 6 Drawing Sheets

METHOD FOR VIA PLATING WITH SEED LAYER

PRIORITY CLAIM

This application claims priority to and is a continuation application of U.S. patent application Ser. No. 14/072,890, filed Nov. 6, 2013 and entitled "Method for Via Plating with Seed Layer," which application is incorporated herein by reference.

BACKGROUND

As modern integrated circuits shrink in size, the associated features shrink in size as well. As transistor shrink, features such as through vias and other electroplated elements shrink in size as well. In many instances, various layers of circuit on chips, dies, in packages, on PCBs and other substrates are interconnected between various layers by way of vias. Typically, the vias are connected to traces or other conductive structures to route electrical signals through dielectric layers. One way of forming a conductive interconnect in a via or trench opening is to form the opening and then plate a conductive metal in the inside of the opening. In some instances, copper, gold, aluminum or other material are plated in the via/trench openings.

The plating process may be performed by electroplating, where an electric current is used to transfer metal in an aqueous solution to a surface. In order to facilitate the plating process, a seed layer may be deposited prior to electroplating. The seed layer provides nucleation sites where the electroplated metal initially forms. The electroplated metal deposits more uniformly on a conformal and even seed layer than on a bare dielectric.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION

The making and using of the illustrative embodiments are discussed in detail below. It should be appreciated, however, that the present disclosure provides many applicable concepts that can be embodied in a wide variety of specific contexts. The specific embodiments discussed are merely illustrative of specific ways to make and use the embodiments of the disclosure, and do not limit the scope of the disclosure.

The present disclosure describes embodiments with regard to a specific context, namely plating using a protection layer over a seed layer. The embodiments of the disclosure may also be applied, however, to a variety of semiconductor devices, plating scenarios or other electrochemical deposition techniques. Hereinafter, various embodiments will be explained in detail with reference to the accompanying drawings.

Plating of semiconductor device surface features is commonly achieved using an electroplating technique, where an ionic metal in solution is deposited on a substrate. In some instances, a metal may be deposited directly on a semiconductor substrate, or on a seed layer. An electric current passed through the substrate and into the solution causes migration of the metal in the solution to the surface of the substrate. Copper is a commonly used metal for electroplating due to its cost, well understood plating properties, and adhesion to many different substrates. Other metals used in the electroplating process may include gold, aluminum, tungsten, cobalt, nickel, chromium, silver, compounds, or alloys of the same, or other conductive materials. In order to control the rate and quality of plating, surface properties, and other variables related to electroplating, various additives may be added to the electroplating solution.

Disclosed herein is a method for reducing defects and providing uniform plating using a protection layer over a seed layer. The protection layer is removed during the plating process by an acid in the electroplating solution. The protection layer removal and plating process are performed in the same processing step, preventing the seed layer from oxidizing and eliminating voids and plating failures where the plated layer adjoins the seed layer.

Figure 1:
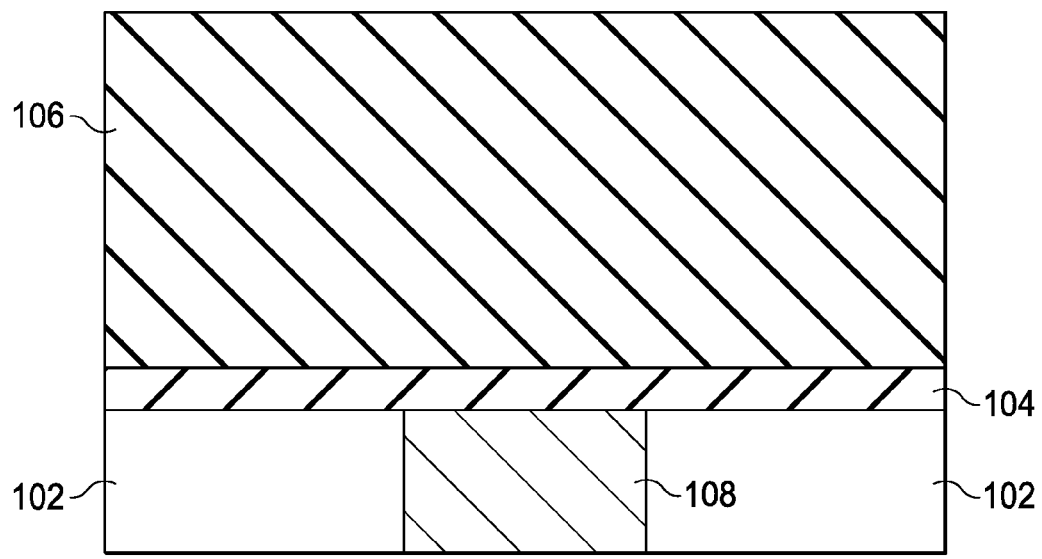
FIGS. 1-9 are cross-sectional views of intermediate steps in a plating process for a via opening according to an embodiment.

FIG. 1 illustrates an initial step in electroplating according to an embodiment. A substrate 102 has a conductive trace 108 disposed therein. An etch stop layer 104 is formed over the substrate 102 and trace 108, and a dielectric layer 106 is formed over the etch stop layer 106.

The conductive trace 108 is exposed at the top surface of the substrate 102 so that a via may be formed over and in electrical contact with the conductive trace 108 by etching the etch stop layer 104 and the dielectric layer 106. In an embodiment, the etch stop layer 104 is a nitride, oxynitride, carbide, a carbon nitride or the like. The dielectric layer 106 may be an oxide, oxynitride or another dielectric material. The material of the etch stop layer 104 is selected to have a high etch selectivity compared to the dielectric layer 106. For example, the dielectric layer may be silicon dioxide ($SiO_2$), and the etch stop layer 104 may be silicon oxynitride (SiON), silicon carbide (SiC), silicon nitride (SiN) or silicon carbon nitride (SiCN), which each have a high etch selectivity compared to $SiO_2$.

The etch stop layer 104 and dielectric layer 106 are each formed separately using chemical vapor deposition (CVD), plasma enhanced CVD (PECVD), by a spin-on process, or another deposition process. The etch stop layer 104 is, in an embodiment, formed with a thickness between about 1 Angstrom and about 100 Angstroms and the dielectric layer is formed with a thickness between about 1000 Angstroms and about 3000 Angstroms.

Figure 2:
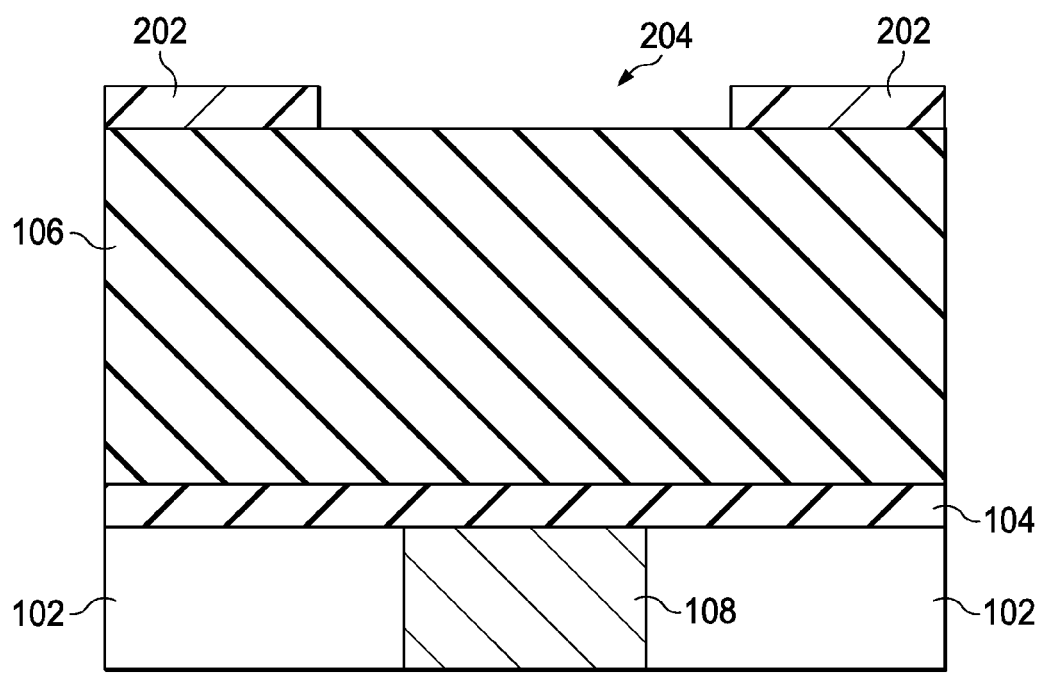

FIG. 2 is a cross-sectional view illustrating formation of a mask 202 on the dielectric layer 106 according to an embodiment. A mask 202 such as a photoresist, hard mask or the like is formed on the dielectric layer 106. The mask 202 is patterned with one or more openings 204 through which the dielectric 106 is etched. For example, where the mask 202 is a photoresist, the photoresist is spun on, sprayed on, or otherwise applied, and exposed and developed to form the opening 204.

Figure 3:
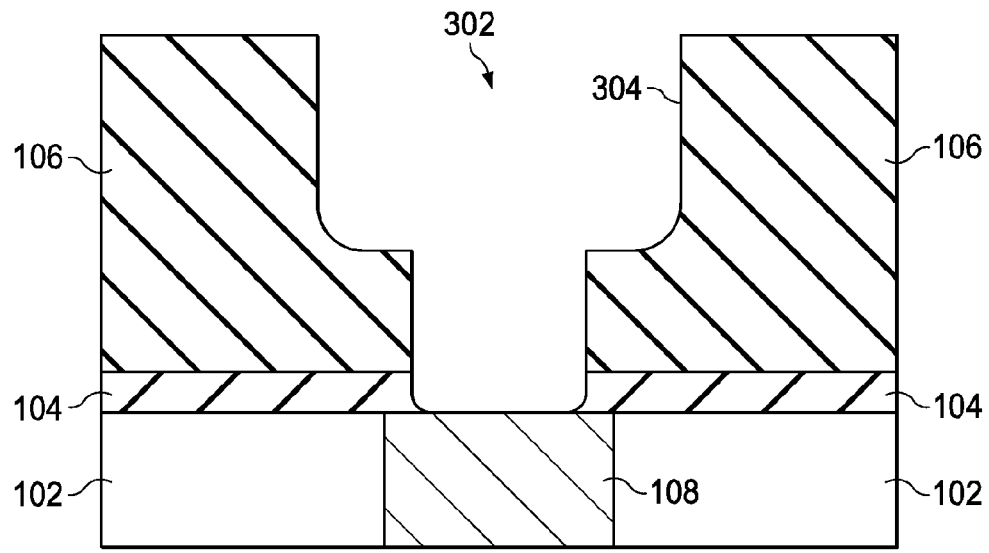

FIG. 3 is a cross-sectional view illustrating etching of the dielectric 106 according to an embodiment. A trench opening or via opening 302 is formed by etching the dielectric layer 106 and etch stop layer 104 to expose at least a portion of the conductive trace 108. While the masking and etching is shown as using a single mask 202, in some embodiments the via opening 302 is formed from multiple masking and etching steps to result in a stepped via opening 302 profile as shown in FIG. 3. The via opening 302 is etched to have sidewalls 304 defined by the dielectric layer 106 and the etch stop layer 104.

In an embodiment, the via opening 302 is formed using a dry etch such as a plasma etch to result in a substantially anisotropic etch, with substantially vertical sidewalls and without undercutting the mask 202 (See, e.g., FIG. 2). For example, where the dielectric layer is $SiO_2$, the via opening 302 may be etched with carbon tetrafluoride ($CF_4$), sulfur hexafluoride ($SF_6$), nitrogen trifluoride ($NF_3$), or the like in a plasma or reactive ion etching (RIE) chamber. However, wet etching, ion milling, or another etching technique may be advantageously employed depending on the desired etched via opening 302 shape, material of the dielectric layer 106, material of the etch stop layer 104, or other processing parameter.

Figure 4:
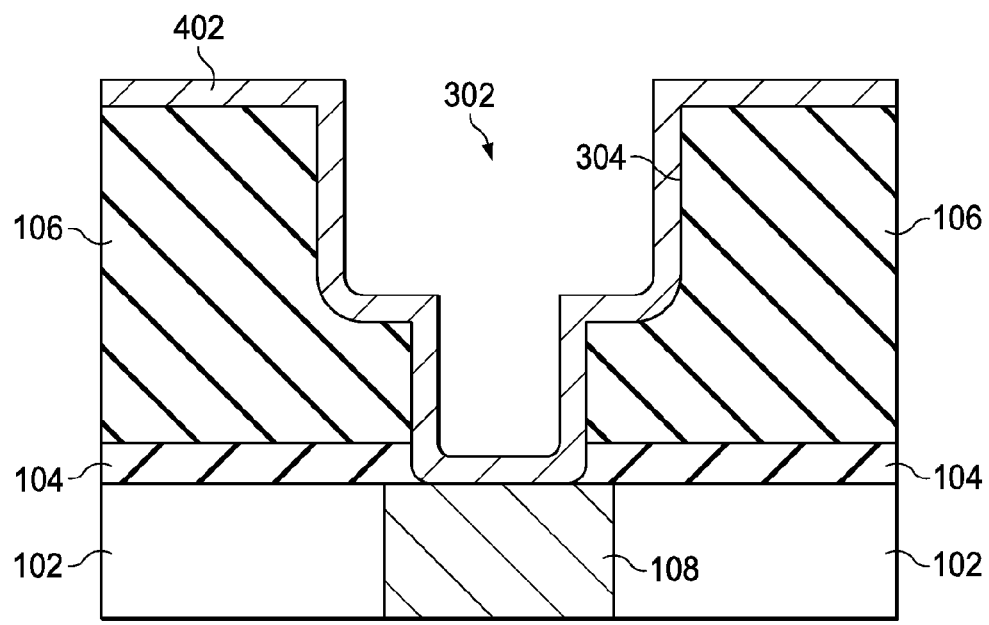

FIG. 4 is a cross-sectional view illustrating formation of a seed layer 402 in the via opening 302 according to an embodiment. In an embodiment, the seed layer 402 is formed as a conformal coating on the via opening surface 304, and in some embodiments, is also formed on the top surface of the dielectric layer 106. The seed layer 402 extends through the dielectric layer 106 and the etch stop layer 104 to the bottom of the via opening 302 to contact the trace 108

In an embodiment, the seed layer 402 is a metal such as copper (Cu), aluminum (Al), titanium (Ti), gold (Au), manganese (Mn), an alloy, or another material that accepts an electroplated layer. The seed layer 402 is formed by atomic layer deposition (ALD), plasma enhanced ALD (PEALD), CVD, PECVD or another process to a thickness between about 1 Angstrom and about 100 Angstroms.

Figure 5:
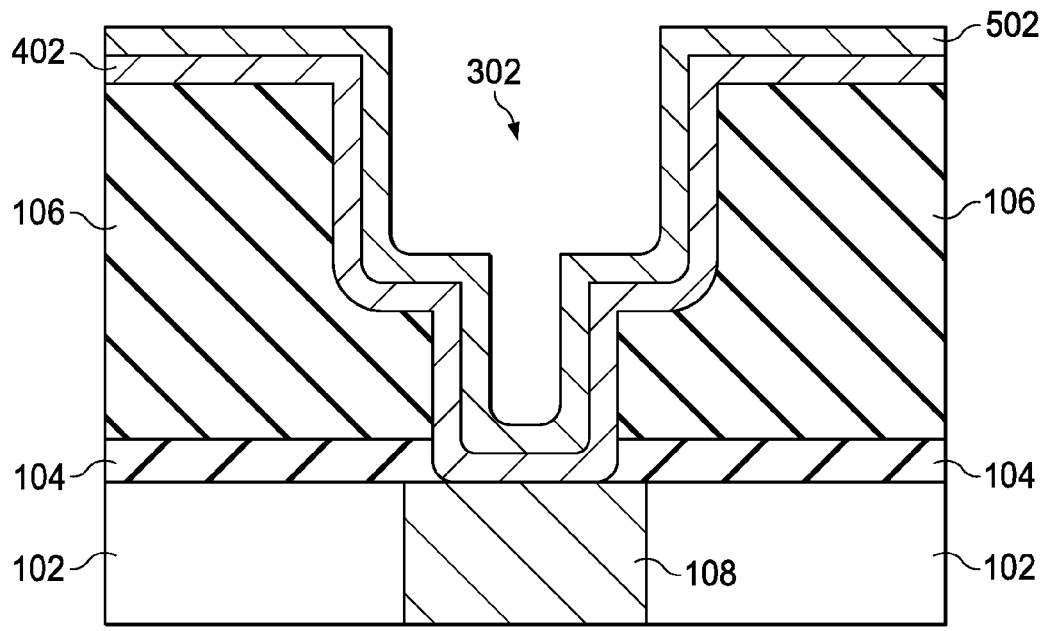

FIG. 5 is a cross-sectional view illustrating formation of a protection layer 502 according to an embodiment. The protection layer 502 is formed over the seed layer 402, protecting the seed layer 402 from oxidation and contamination. The protection layer 502 is formed by ALD, PEALD, CVD, PECVD or another deposition process to a thickness between about 1 Angstrom and about 50 Angstroms. In an embodiment, the seed layer 402 and the protection layer 502 are formed in an inert environment to prevent oxidation of the seed layer prior to and during formation of the protection layer. For example, the seed layer 402 and protection layer 502 are formed in a single CVD processing chamber in an argon (Ar) environment. The argon environment is maintained during formation of the seed layer 402 and through the formation of the protection layer 502. The argon displaces oxygen that would oxidize the seed layer 402, resulting in a seed layer 402 substantially free of oxidation after formation of the protection layer 502.

The protection layer 502 is formed from a material having a lower reduction-oxidation potential than the material to be plated. For example, in an embodiment where the seed layer 402 is copper, and the electroplating material is copper, the protection layer 502 is Mn, cobalt (Co), Ti, Al, vanadium (V), chromium (Cr), zinc (Zn), zirconium (Zr), and alloys or oxides of the same.

Figure 6:
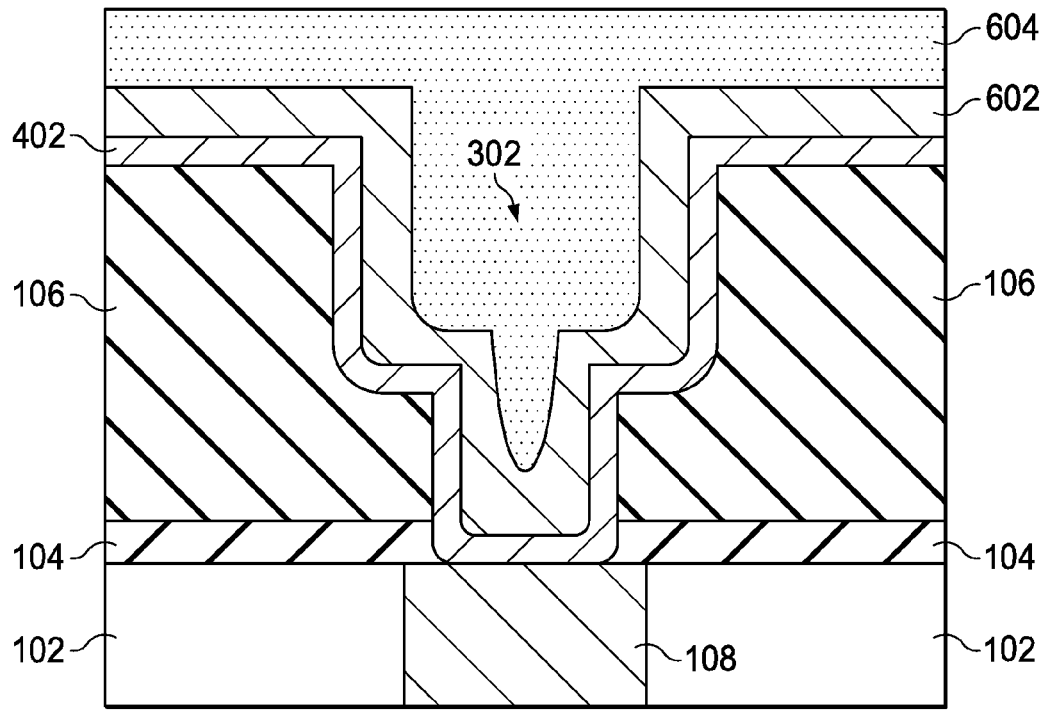

FIG. 6 is a cross sectional view illustrating removal of the protection layer 502 and formation of the via layer 602 by in a single process step according to an embodiment. Impurities introduced into the seed layer 402 by oxidation cause gaps, voids and defects in the electroplated structure, resulting in inconsistencies and reliability problems in finished devices. Thus, by removing the protection layer 502 and forming the via layer 602, simultaneously, or in a single step while in a plating bath such as an electroplating solution, the via layer 602 and seed layer 402 are substantially free of oxidation in the center region of the via opening 302. The simultaneous removal of the protection layer 502 and formation of the via layer 602 in a single process step prevents oxidation of the seed layer since the seed layer 402 is never exposed to an oxidizer prior to formation of the via layer 602.

In an embodiment, the via layer 602 is formed by electroplating. The workpiece with the protection layer 502 (See, FIG. 5) and seed layer 402 are submersed in an electroplating solution 604 having an acid that removes the protection layer 502 without significantly interfering with the electroplating process. The acid component of the electroplating solution 604 permits the removal of the protection layer 502 and formation of the via layer 602 in a single processing step. Maintaining the seed layer 402 in the electroplating solution 604 during removal of the protection layer 402 and through formation of the via layer 602 prevents oxidation of the seed layer 402. In other embodiment, the via layer 602 is formed by a wet plating process such as electroless nickel plating, electroless palladium plating, immersion tin plating, immersion gold plating, immersion silver plating or another plating process.

In an embodiment, the via layer 602 is copper, and the electroplating solution has copper sulfate ($CuSO_4$) and sulfuric acid ($H_2SO_4$) providing the ionic copper plating source and the acid for removing the protection layer 302. In such an embodiment, the electroplating solution has an ionic copper (Cu+) concentration by weight between about 2.0% and about 3.7%. In such an embodiment, the sulfuric acid concentration is great enough to reduce the pH of the electroplating solution to about 6.0 or less.

The electroplating process is accomplished by applying a voltage potential between the seed layer 402 and an anode in the electroplating solution 604. A positive voltage is applied to the anode, with a lower voltage applied to the seed layer 402. The voltage causes the ionic copper in the electroplating solution 604 to deposit on the seed layer 402. The electroplating voltage controls the rate at which the deposition material accumulates on the seed layer 402. A higher voltage results in a more rapid via layer 602 formation. The voltage is maintained at a level sufficient to overcome the etching of the via layer 602 by the acid in the electroplating solution 604. Thus, the voltage will cause the electroplating material to be deposited faster than it is etched away by the acid in the electroplating solution 604. The pH or reactivity of the electroplating solution 604 dictates adjustments of the voltage. For example, a pH of around 6 require a lower electroplating voltage to prevent overgrowth of the via layer 602 and formation of voids in the via opening as the corners of the via later close at the top of the via opening. In contrast, a pH of, for example 4 requires a higher voltage since the higher reactivity of the acid in the electroplating solution 604 removes material from the via layer 602 faster than a lower pH solution.

The electroplating solution 604 may also have additional processing components. In order to provide a smoother plated surface and reduce the errors introduced in small features by plating, many electroplating solutions also include additives such as brighteners, levelers, and suppressors. Organic compounds are added to an electroplating solution and act as levelers and brighteners, increasing uniformity of metal deposition on different regions of the target surface including through holes and recesses. Additionally, salts such as chlorides, may also be included in an electroplating bath to as a brightener and to increase the deposition of plating materials Organic compound such polyethylene glycol (PEG) or, alternatively, polyalkylene glycol (PAG) function as suppressors, while organic sulfides such as Bis(3-sulfopropyl)-disodium-sulfonate ($C_6H_{12}Na_2O_6S_4$) (SPS) work as accelerators.

Figure 7:
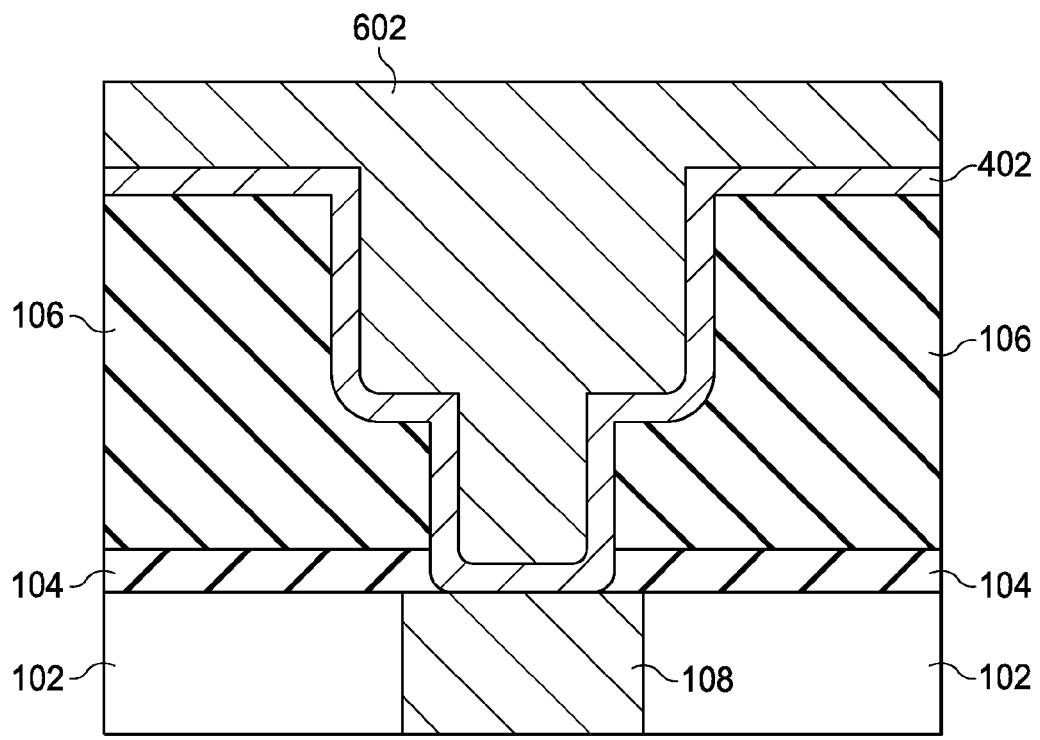

FIG. 7 is a cross-sectional illustrating a via layer 602 after electroplating according to an embodiment. The via layer 602 extends above the top surface of the dielectric layer 106 and contacts the upper or outer surface of the seed layer 402.

Figure 8:
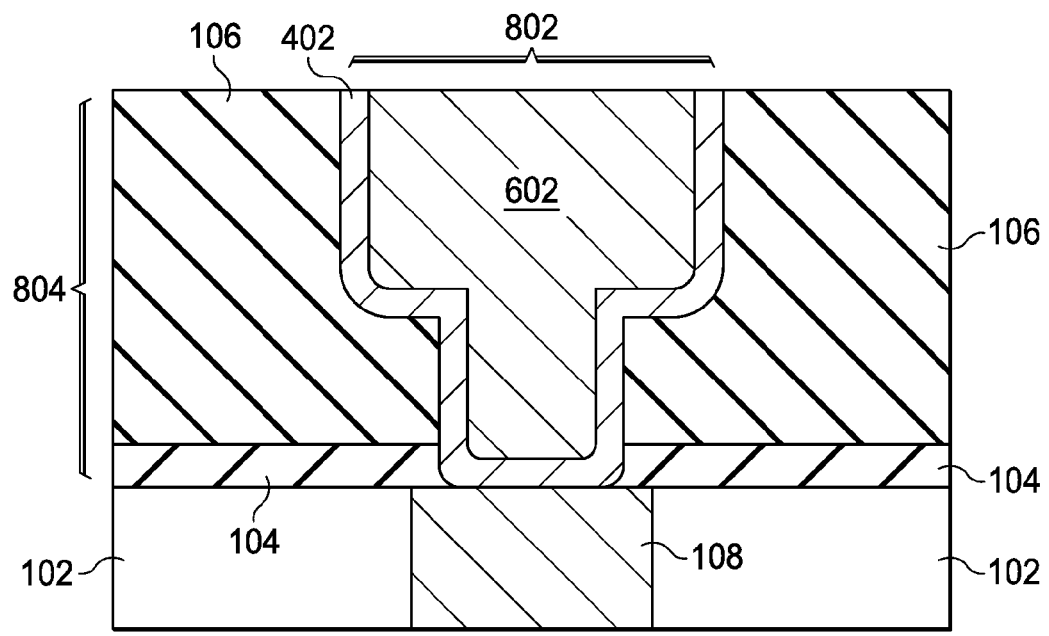

FIG. 8 is a cross-sectional illustrating a via layer 602 after electroplating according to an embodiment. In such an embodiment, the via layer 602 is removed to expose an upper surface of the dielectric layer 106. The via layer 602 (See, FIG. 7) and seed layer 402 are reduced, for example, by chemical-mechanical polishing (CMP), grinding, milling, polishing, etching or another technique to result in a via 802 in the dielectric layer and extending to the trace 108. Thus, in an embodiment, the dielectric layer 106, etch stop layer 104 and via 802 form a structure such as an intermetal dielectric (ILD). However, in other embodiments, the electroplating process described herein may also be used for forming metal structures in passivation layers, on PCBs, on packaging, or in other fabrication scenarios.

The embodiments described above with respect to FIGS. 1-8 illustrate formation of a single via in a single dielectric layer. However, the above described embodiments are illustrative as to a method for electroplating a via, and are not intended to be limiting. For example, in an embodiment, a redistribution layer (RDL) may have a plurality of dielectric layers with vias formed therein by electroplating in successive electroplating processing steps.

Figure 9:
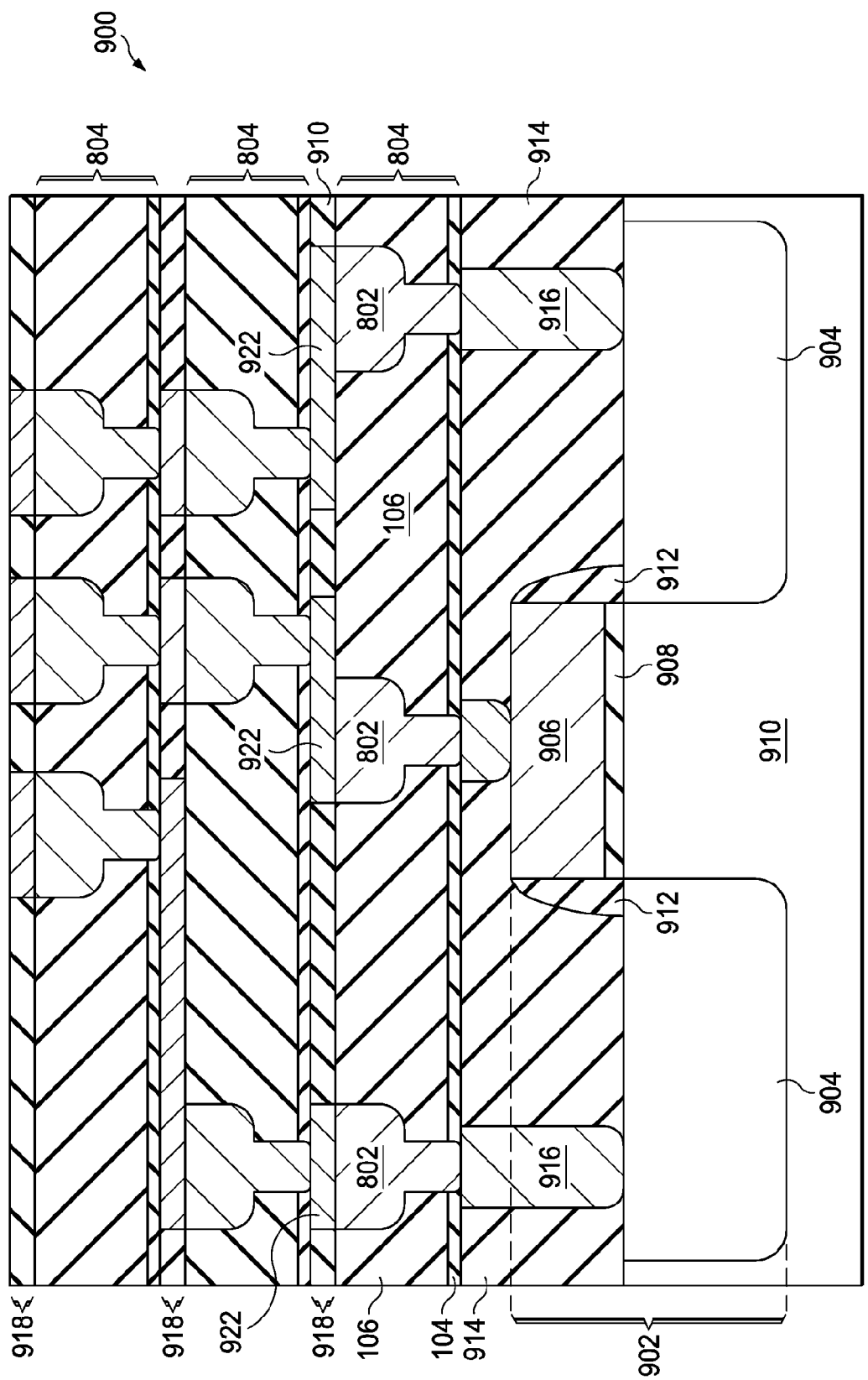

FIG. 9 is a cross sectional view of a device having a plurality of intermetal dielectric layers (IMDs) 804 with electroplated vias 802 disposed therein according to an embodiment. An active device 902 such as a transistor has source/drain regions 904 disposed in a substrate 910. Such a transistor also has a gate with a gate contact 906 disposed over a gate oxide 908 and gate spacers 912 disposed on the sidewalls of the gate contact 906. A passivation layer 914 such as an oxide, nitride or the like is disposed over the transistor 902 and has one or more contacts 916 extending there through to the transistor 902 to provide electrical connectivity to higher layers.

An RDL over the passivation layer 914 has one or more ILD layers 804 and one or more metallization layers 918 arranged in a stack to provide connectivity between the transistor 902 and an external die, device, board, contact grid or like structure. The ILD layers 804 each have a dielectric layer 106 and etch top layer 104, with one or more vias 802 disposed therein. Each ILD layer 804 is formed using an iteration of the protection layer and electroplating process described above with respect to FIGS. 1-8. Metallization layers 918 having a dielectric and one or more metal features 922 may be disposed between the ILD layers 804, providing lateral connectivity between the vias 802.

Figure 10:
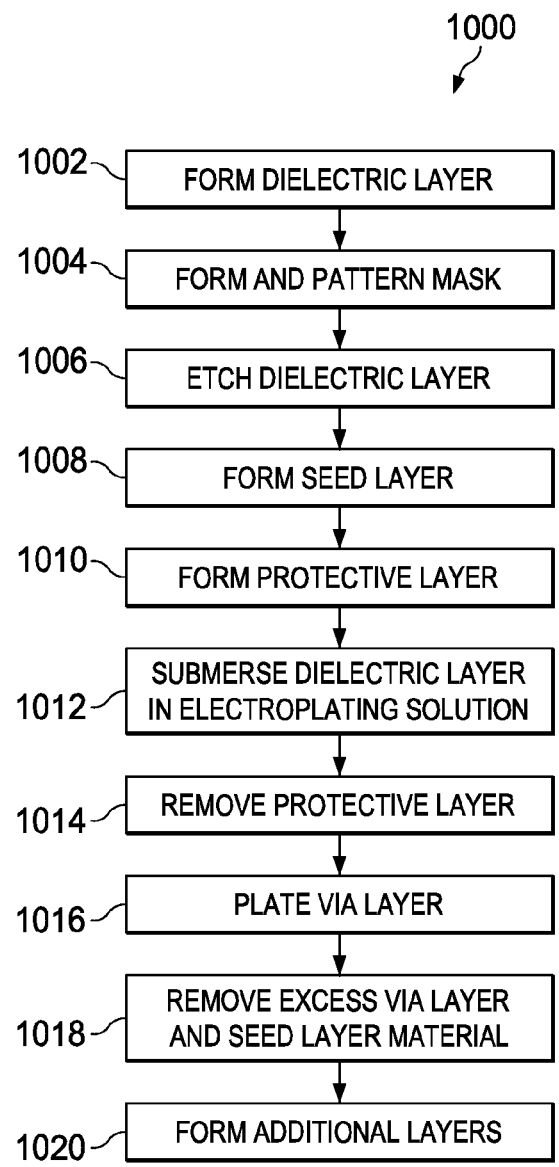
FIG. 10 is a flow diagram illustrating a method of plating using protection layer according to an embodiment.

FIG. 10 is a flow diagram illustrating a method 100 for forming a plated via according to an embodiment. In such an embodiment, the via layer is formed by electroplating. A dielectric layer is formed in block 1002, and a mask is formed and patterned in block 1004. The dielectric layer is etched in block 1006 using the patterned mask. In an embodiment, the forming the mask, patterning the mask and etching the dielectric layer are performed multiple times to form a via opening with a complex or stepped profile. A seed layer is formed within the via opening in block 1008, and a protection layer is formed over the seed layer in block 1010. The dielectric layer, with the seed layer and protection layer, is submersed in a plating solution such as a electroplating solution, in block 1012. The protection layer is removed in block 1014 and the via layer is plated in block 1016. The protection layer is removed and the via layer is plated in a single process step, namely, while the dielectric layer is submersed in the plating solution. Excess via layer material and seed layer material are removed in block 1018 by reducing the via layer and seed layer though polishing, CMP, or the like. Additionally layers are formed in block 1020.

Thus, according to an embodiment, a method of forming a structure comprises forming a via opening in a dielectric layer, forming a seed layer on a sidewall of the via opening, forming a protection layer over the seed layer, and exposing the protection layer and the seed layer to an electroplating solution, the electroplating solution removing the protection layer and depositing a via layer on the seed layer. A via is formed by reducing a surface of the via layer. The electroplating solution comprises an acid, and the acid removes the protection layer during exposure of the protection layer to the electroplating solution. The electroplating solution has a pH of less than about 6 and comprises an ionic metal at a concentration by weight between about 2.0% and about 3.7%, with the ionic metal deposited on the seed layer to form the via layer. The protection layer has a reduction-oxidation potential lower than a material of the ionic metal. The ionic metal is copper, and the protection layer comprises at least one of manganese, cobalt, titanium, aluminum, vanadium, chromium, zinc, zirconium, or oxides of the same.

According to another embodiment, a method for plating comprises providing a substrate having a dielectric layer formed over a trace, and forming a via opening extending through the dielectric layer, the via opening exposing a surface of the trace. The method further comprises forming a seed layer in the via opening and contacting the trace and forming a protection layer over the seed layer. The protection layer is removed and a via layer deposited on the seed layer in a single plating process step by applying a plating solution in the via opening.

According to another embodiment, a method of forming a structure comprises a plurality of intermetal dielectrics (IMDs) having at least one via disposed through dielectric layer. Forming each of the plurality of IMDs comprises forming a seed layer in a via opening in dielectric layer, forming a seed layer in the via opening and contacting a metal feature below the etch stop layer, forming a protection layer over the seed layer and forming a via layer in the via opening and in contact with the seed layer by applying an electroplating solution in the via opening, the electroplating solution removing the protection layer and depositing a via layer on the seed layer. A via is formed by reducing a surface of the via layer, the via disposed in the via opening. A metallization layer is formed over at least one of the plurality of IMDs.

In one aspect, embodiments disclosed herein may provide for a method of forming a structure that includes forming a via opening in a dielectric layer, and forming a seed layer on a sidewall of the via opening. The method further includes forming a metallic protection layer over the seed layer, and simultaneously removing the metallic protection layer and depositing a via layer on the seed layer.

In another aspect, embodiments disclosed herein may provide for a method including providing a substrate having a dielectric layer formed over a trace, and forming a via opening extending through the dielectric layer, the via opening exposing a surface of the trace. The method further includes forming a seed layer in the via opening and contacting the trace, and forming a conductive protection layer over the seed layer. The method yet further includes simultaneously removing the protection layer and depositing a via layer on the seed layer in a single plating process step.

In yet another aspects embodiments disclosed herein may provide for a method of forming a structure that includes forming a plurality of intermetal dielectrics (IMDs) having at least one via disposed through a dielectric layer. Forming each of the plurality of IMDs includes the steps of forming a seed layer in the via opening and contacting a metal feature below the dielectric layer, forming a protection layer over the seed layer, and simultaneously removing the protection layer and forming a via layer in the via opening and in contact with the seed layer by applying an electroplating solution in the via opening. Additionally, a metallization layer may be formed over at least one of the plurality of IMDs Although embodiments of the present disclosure and its advantages have been described in detail, it should be understood that various changes, substitutions, and alterations can be made herein without departing from the spirit and scope of the disclosure as defined by the appended claims.

Moreover, the scope of the present application is not intended to be limited to the particular embodiments of the process, machine, manufacture, composition of matter, means, methods, and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a structure, comprising:
   forming a via opening in a dielectric layer;
   forming a seed layer on a sidewall of the via opening;
   forming a metallic protection layer over the seed layer; and
   simultaneously removing the metallic protection layer and depositing a via layer on the seed layer.

2. The method of claim 1, wherein the metallic protection layer is removed by exposure to a electroplating solution.

3. The method of claim 1, wherein the electroplating solution comprises an acid.

4. The method of claim 1, further comprising chemical mechanical polishing a top surface of the via layer to form a conductive via.

5. The method of claim 1 wherein the protection layer comprises a metallic material.

6. The method of claim 5, wherein the electroplating solution comprises an ionic metal at a concentration by weight between about 2.0% and about 3.7%, the ionic metal deposited on the seed layer to form the via layer.

7. The method of claim 6, wherein the metallic protection layer has a reduction-oxidation potential lower than a material of the ionic metal.

8. The method of claim 6, wherein the ionic metal is copper, and the protection layer comprises at least one of manganese, cobalt, titanium, aluminum, vanadium, chromium, zinc, zirconium, or oxides of the same.

9. The method of claim 1, wherein the seed layer and protection layer remain substantially free of oxidation.

10. A method, comprising:
    providing a substrate having a dielectric layer formed over a trace;
    forming a via opening extending through the dielectric layer, the via opening exposing a surface of the trace;
    forming a seed layer in the via opening and contacting the trace;
    forming a conductive protection layer over the seed layer; and
    simultaneously removing the protection layer and depositing a via layer on the seed layer in a single plating process step.

11. The method of claim 10, wherein the step of simultaneously removing the protection layer and depositing a via layer includes exposing the protection layer to an electroplating solution.

12. The method of claim 11, wherein the plating solution is an electroplating solution and comprises an acid, and wherein the acid removes the metallic protection layer during the forming the via layer.

13. The method of claim 11, wherein the electroplating solution has a pH of less than about 6.

14. The method of claim 11, wherein the electroplating solution comprises an ionic metal at a concentration by weight between about 2.0% and about 3.7%, the ionic metal deposited on the seed layer to form the via layer.

15. The method of claim 11, wherein the metallic protection layer has a reduction-oxidation potential lower than a material of the ionic metal.

16. The method of claim 14, wherein forming the via layer comprises electroplating the ionic metal onto the seed layer using an electroplating voltage sufficient to deposit the ionic metal faster than the acid of the electroplating solution removes a material from the via layer.

17. The method of claim 14, wherein the protection layer comprises a material selected from the group consisting of manganese, cobalt, titanium, aluminum, vanadium, chromium, zinc, zirconium, oxides of the same, and alloys of the same.

18. A method of forming a structure, comprising:
    forming a plurality of intermetal dielectrics (IMDs) having at least one via disposed through a dielectric layer, forming each of the plurality of IMDs comprising:
        forming a seed layer in the via opening and contacting a metal feature below the dielectric layer;
        forming a protection layer over the seed layer;
        simultaneously removing the protection layer and forming a via layer in the via opening and in contact with the seed layer by applying an electroplating solution in the via opening; and
    forming a metallization layer over at least one of the plurality of IMDs.

19. The method of claim 18, wherein the protection layer comprises a material selected from the group consisting of manganese, cobalt, titanium, aluminum, vanadium, chromium, zinc, zirconium, oxides of the same, and alloys of the same.

20. The method of claim 18, wherein the electroplating solution removes the protection layer and forms a metal via layer on the seed layer.

* * * * *